(12) United States Patent
Van Zeijl

(10) Patent No.: US 8,195,111 B2
(45) Date of Patent: Jun. 5, 2012

(54) HARMONIC GENERATION OF A FUNDAMENTAL FREQUENCY SYSTEM AND METHOD

(75) Inventor: Paulus Thomas Maria Van Zeijl, Veldhoven (NL)

(73) Assignee: ST-Ericsson SA, Geneva (CH)

(*) Notice: Subject to any disclaimer, the term of this patent is extended or adjusted under 35 U.S.C. 154(b) by 880 days.

(21) Appl. No.: 11/576,341

(22) PCT Filed: Sep. 21, 2005

(86) PCT No.: PCT/IB2005/053114
§ 371 (c)(1),
(2), (4) Date: Sep. 26, 2008

(87) PCT Pub. No.: WO2006/035373
PCT Pub. Date: Apr. 6, 2006

(65) Prior Publication Data
US 2011/0105057 A1    May 5, 2011

Related U.S. Application Data

(60) Provisional application No. 60/614,384, filed on Sep. 29, 2004.

(51) Int. Cl.
*H01Q 11/12*    (2006.01)
(52) U.S. Cl. ............... 455/127.2; 455/260; 375/317; 375/373; 375/376

(58) Field of Classification Search ............... 455/127.2
See application file for complete search history.

(56) References Cited

U.S. PATENT DOCUMENTS

| | | | | |
|---|---|---|---|---|
| 4,504,975 | A * | 3/1985 | Jarret et al. | 398/208 |
| 5,436,934 | A * | 7/1995 | Co | 375/351 |
| 5,825,257 | A * | 10/1998 | Klymyshyn et al. | 332/100 |
| 5,990,712 | A * | 11/1999 | Corman et al. | 327/121 |
| 6,125,158 | A * | 9/2000 | Carson et al. | 375/376 |
| 6,246,268 | B1 * | 6/2001 | Cheng | 327/65 |
| 6,441,650 | B2 * | 8/2002 | Nikhade | 327/66 |
| 7,054,403 | B2 * | 5/2006 | Nosaka et al. | 375/376 |
| 7,386,072 | B2 * | 6/2008 | Uno | 375/344 |

OTHER PUBLICATIONS

Zolfaghari et al: A Low-Power 2.4 GHz Transmitter/Receiver CMOS IC; IEEE-JSSC; vol. 28, No. 2; Feb. 2, 2003; pp. 176-183.
Darabi Hooman et al: "A 2.4-GHz CMOS Transceiver for Bluetooth"; IEEE-JSSC vol. 36, No. 12; Dec. 2001; pp. 2016-2023.

* cited by examiner

*Primary Examiner* — Duc Nguyen
*Assistant Examiner* — Ajibola Akinyemi

(57) ABSTRACT

A system and method for generating for efficiently obtaining a desired harmonic from a fundamental frequency the prior art is needed. The system and method of the present invention produces a desired harmonic by employing techniques using gain stages (or limiter/comparator circuits) in combination with pre-defined offset voltages (or currents). The output signals of the gain stages are added with the correct phase to generate the desired harmonic.

18 Claims, 4 Drawing Sheets

HARMONIC GENERATION OF A FUNDAMENTAL FREQUENCY SYSTEM AND METHOD

CROSS REFERENCE TO RELATED APPLICATION

This application claims the benefit of U.S. provisional application Ser. No. 60/614,384 filed Sep. 29, 2004, which is incorporated herein whole by reference.

The present invention relates to a system and method for the generation of a harmonic of a fundamental frequency for use in an analog integrated circuit. In particular, for use with a local oscillator or LO-pulling of a single die radio frequency transceiver.

For example, today's radio transceivers contain most of their functionality in a single chip. This allows for high scale integration, making radio frequency (RF) transceivers very cost effective for use in consumer products. However, when all RF functionality is placed into a single die, 'LO-pulling' or 'VCO-pulling' presents itself as problem for designers of such chips to solve.

LO-pulling occurs when a fraction of the transmit signal couples back to the voltage controlled oscillator (VCO) of the frequency synthesizer. The transmit signal is modulated with the information to be transmitted, so the VCO is modulated as well. Since the VCO is used to generate the transmit signal, e.g., by means of a mixer, a feedback loop exists that severely degrades the quality of the transmit signal. Due to the regenerative nature of the VCO, even the smallest coupling can have a severe impact on the quality of the transmit signal.

Several alternative schemes for generating an LO signal for a transmit mixer have been proposed in the literature. All proposed schemes have the objective of reducing the pulling of the VCO, see, e.g., Zolfaghari, Alireza and Razavi, Behzad: 'A Low-Power 2.4 GHz Transmitter/Receiver CMOS IC', IEEE-JSSC, vol. 38, no. 2, February 2003, pps. 176-183 and Darabi, Hooman et al.: 'A 2.4-GHz CMOS Transceiver for Bluetooth', IEEE-JSSC, vol. 36, no. 12, December 2001, pps. 2016-2023. These proposed schemes either employ a two-stage up-conversion of the transmit signal or a two-stage generation of the LO signal, in order to avoid a harmonic relation between the transmit signal (or its harmonics) and the VCO frequency. In either case, however, a large amount of harmonics, sub-harmonics and mixing products are present and some of these mixing products can still cause VCO pulling. In some such proposed schemes a significant amount of filtering is required to suppress unwanted spectral components.

One approach proposed by Darabi comprises a local oscillator for producing output signals having a desired frequency, for example 2400 MHz. The local oscillator includes a VCO circuit, a buffer, a frequency divider for producing 800 MHz in-phase LO component I and quadrature component Q signals that are half the output of the VCO, and two mixers. The VCO circuit produces a 1600 MHz signal, which is then provided via a buffer to a frequency divider circuit, which produces an in-phase signal, and a quadrature signal having a frequency that is 800 MHz, or half the frequency output by the VCO.

Another approach for the generation of the LO-signals in order to avoid pulling of VCOs in fully integrated receivers is described in co-pending U.S. patent application Ser. No. 10/555,397, which is hereby incorporated by reference. The approach is based on the generation of the $3^{rd}$ harmonic of the VCO-signal. The proposed generation of the $3^{rd}$ harmonic is by limiting the VCO-signal into a square-wave. A filter then filters the third harmonic from this signal. However, this signal also contains a large amount of spurious signals, such as the component at the fundamental frequency, the component at the $2^{nd}$, $4^{th}$, $5^{th}$ harmonic, etc). In order to generate a signal that has a low amount of spurious components, a band-pass filter is needed. Such a band-pass filter includes an inductor, which consumes a large (silicon) area if integrated. Moreover, if the filtering requires a high-Q inductor and capacitor, tuning and/or trimming is required to put the filter center frequency exactly on the $3^{rd}$ harmonic.

Thus, a solution for efficiently obtaining a desired harmonic from a fundamental frequency the prior art is needed. The system and method of the present invention produces such a desired harmonic by employing techniques using gain stages (or limiter/comparator circuits) in combination with pre-defined offset voltages (or currents). The output signals of the gain stages are added with the correct phase to generate the desired harmonic. For instance, a number of gain stages are used to approximate a desired Taylor-expansion transfer-function, such that the required output signal is reached. The system and method of the present invention, when used in a local oscillator, avoids any harmonic relation between the transmit signal and the VCO frequency, without generation of intermediate signals close to the VCO frequency.

According to one aspect of the present invention a harmonic generation circuit is provided for generating a transmit signal having a desired frequency, said circuit comprising a transmit-generation circuit including a first comparator, a second comparator having a predetermined offset voltage, and an adder to sum the outputs of the first and second comparators, wherein said transmit-generation circuit to receive a first sinusoidal signal having a first frequency and derive therefrom the transmit signal having the desired frequency such that there is no harmonic relation between the desired frequency of the transmit signal and the first frequency, and wherein said second comparator generates an output signal when the sinusoidal signal is larger than its offset voltage. The desired harmonic is preferably the third harmonic.

It is to be understood by persons of ordinary skill in the art that the following descriptions are provided for purposes of illustration and not for limitation. An artisan understands that there are many variations that lie within the spirit of the invention and the scope of the appended claims. Unnecessary detail of known functions and operations may be omitted from the current description so as not to obscure the present invention.

Figure 1:
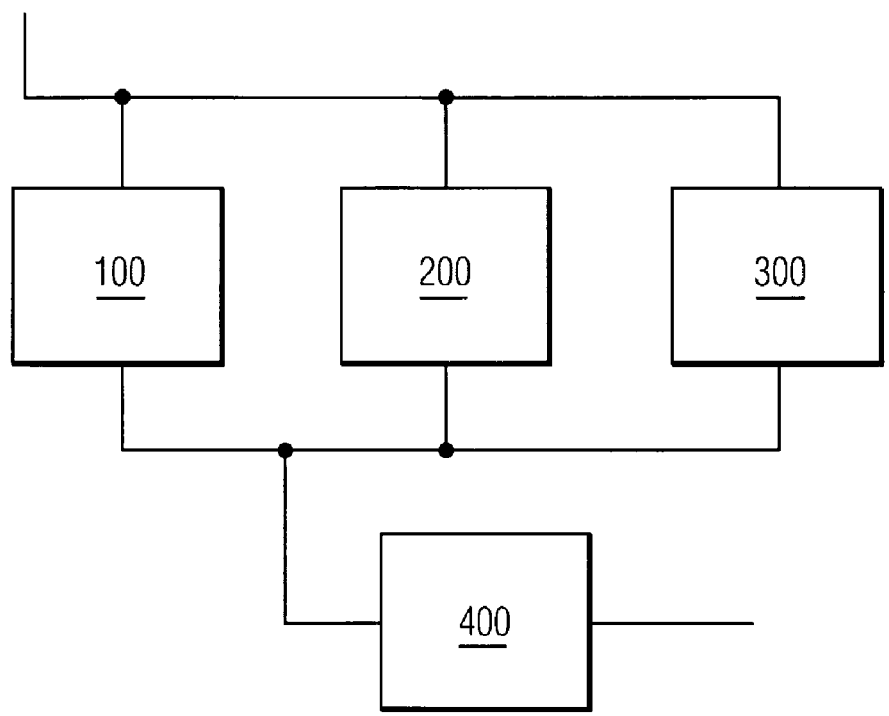
FIG. 1 illustrates a first preferred embodiment of harmonic generation circuit, according to the present invention.

In a first embodiment, a harmonic generation circuit is illustrated in FIG. 1. The sinusoidal input signal is input to a first gain stage 100. A second gain stage 200 is also connected to the sinusoidal input signal with a predetermined offset voltage. A third gain stage 300 is connected to the sinusoidal input signal with a predetermined offset voltage. The output signal is generated by adding the output signals with the correct phase in adder 400.

Advantageously, the harmonic generation circuit can be applied to analog integrated circuits, in particular the generation of local oscillator signals in radios that avoid pulling phenomena. In addition, the harmonic generation circuit requires a smaller amount of chip area, thus, is more cost effective.

Figure 2:
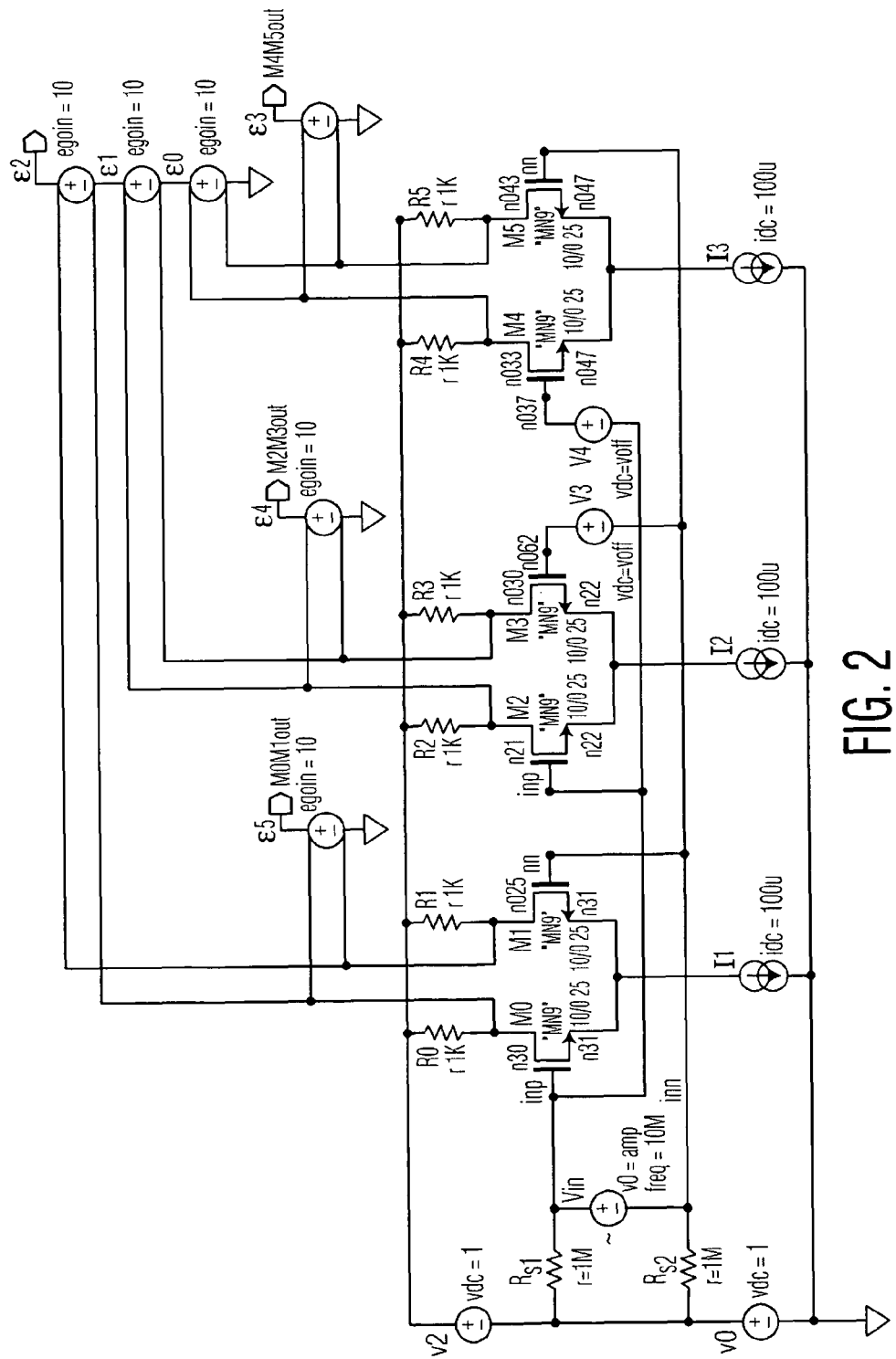
FIG. 2 illustrates another preferred embodiment of harmonic generation circuit, according to the present invention.

In another embodiment, a harmonic generation circuit is illustrated in FIG. 2. The sinusoidal input signal is input to a first comparator M0 and M1 (for example, implemented using transistors) and collectively a first gain stage. A second comparator M2 and M3 (for example, implemented using transistors) and collectively a second gain stage is also connected to the sinusoidal input signal, but here a predetermined offset voltage (for example, 0.8 V) is inserted in series with the gate of M3. A third comparator M4 and M5 (for example, implemented using transistors) and collectively a third gain stage is also connected to the sinusoidal input signal, but here the predetermined offset voltage (for example 0.8 V) is inserted in series with the gate of M4. The output signal is generated by adding the output signals with the correct phase (in particular, the output of differential pair M2-M3 and M4-M5 is subtracted from the output signal of M0-M1). One manner of generating an offset (not shown) is by providing a resistance in series with the source of the transistors to generate the offset voltage. A capacitor in parallel with the resistor decouples DC and AC performance.

As is apparent to those skilled the art, the comparator function and the gain function are combined in a differential pair. The outputs of the differential pairs (the drains of M0-M5) can be connected directly to each other with the correct phase (not shown). Alternatively, the comparator and gain functions may be implemented by two separate circuits, which may result in increased performance for specific applications. For example, two comparators that detect the level at which time to switch-on two gain functions.

In addition, a level detection circuit can be added that measures the amplitude of the incoming signal and adjusts the offset voltages such that the circuit always operates around the optimum (i.e. where the fundamental frequency is cancelled) (not shown).

In operation, the output signal (M0M1out) of the M0-M1 differential pair is an amplified version of the input signal. The differential pair M2-M3 starts generating an output signal (M2M3out) when the input signal is larger than the offset voltage in series with the gate of M3. The differential pair M4-M5 starts generating an output signal (M4M5out) when the input signal is larger than the offset voltage in series with the gate of M4. Adding these signals provides the signal out, which is approximate to the third harmonic of the input signal.

Figure 3:
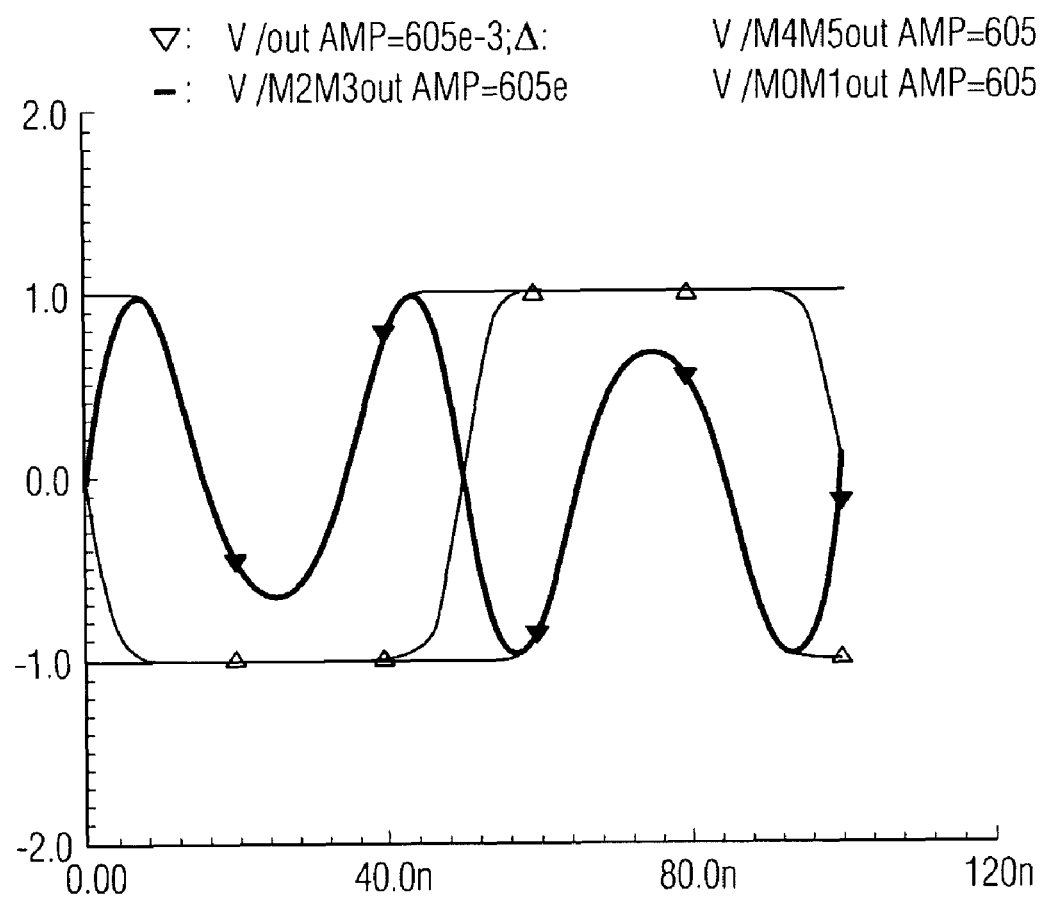
FIG. 3 illustrates output signals of the comparators of the harmonic generation circuit of FIG. 2.

FIG. 3 shows the output signals in the time domain. As is apparent the output signal of M2-M3 is the inverted-upper-top of the sine-wave, while the output signal M4-M5 is the inverted-lower-top of the sine-wave. Adding these to the M0-M1 output signal gives a $3^{rd}$ harmonic.

Figure 4:
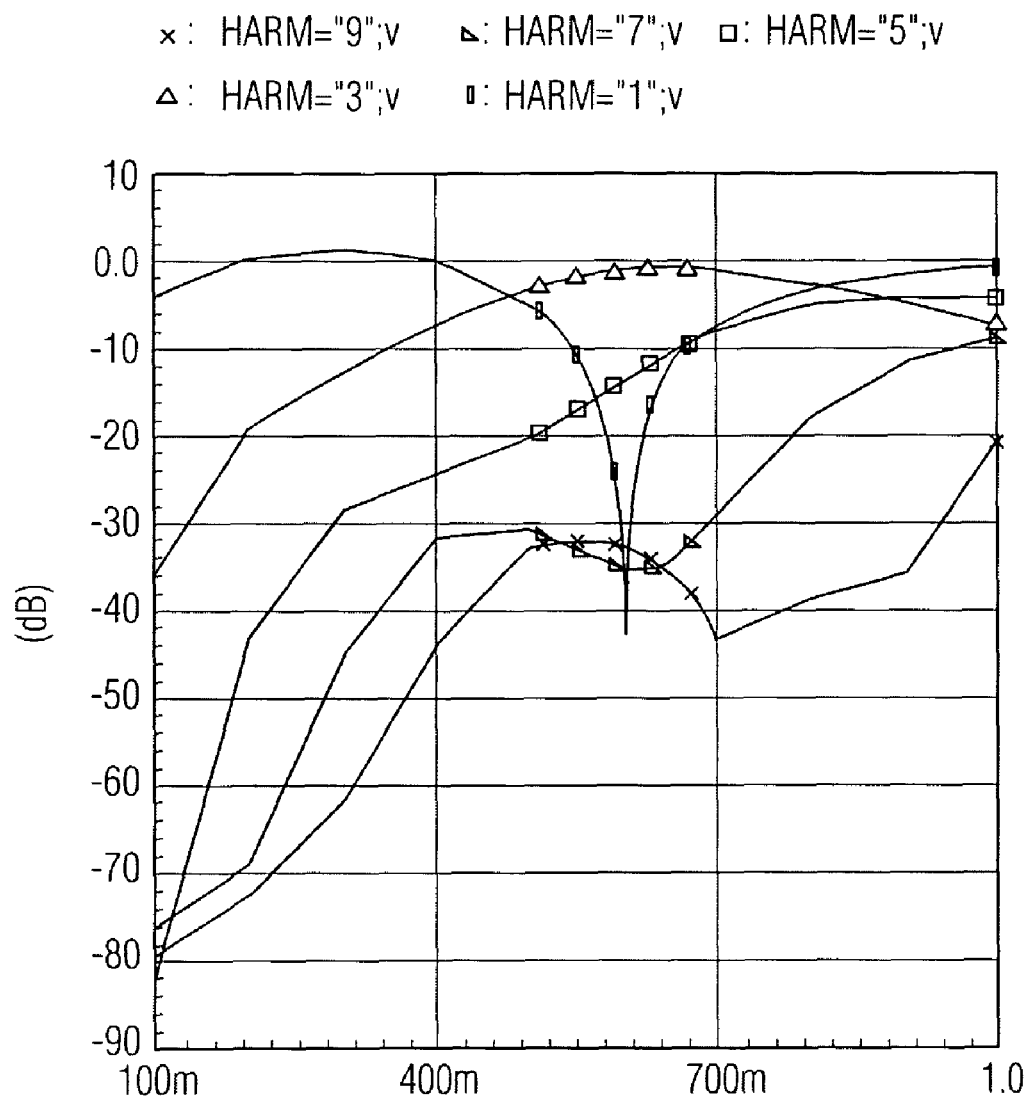
FIG. 4 illustrates the harmonics of the output signal versus the input signal amplitude of the circuit of FIG. 2.

FIG. 4 shows the harmonics of the output signal versus input signal amplitude. For low amplitudes, there is little harmonic content in the output signal, while for input amplitudes of 600 mV, for example, the signal component at the fundamental frequency is cancelled. The present invention lowers the amplitude of the components at the fundamental frequency down to below −35 dBc. The signal component at the $5^{th}$ harmonic is at −16 dBc. The signal components at $7^{th}$ and $9^{th}$ harmonic are −35 and −19 dBc, respectively. However, the $9^{th}$ harmonic is far enough away in frequency that attenuation of this component with a simple filter is quite easy. As is apparent, even order components are not present in the output spectrum. In this manner, the present invention derives the signal having the desired frequency while substantially canceling other frequencies.

The present invention recognizes that a desired Taylor polynomial can be approximated. For example, for a given transfer function in the form of a Taylor polynomial:

$$y=x+c^*x^3$$

with y being the output signal, x being the input signal, and c being a constant. Using $$x=A\sin(\omega t)$$

gives $$y = \left(A + \frac{3*c*A^3}{4}\right)*\sin(\omega t) - \left(\frac{c*A^3}{4}\right)*\sin(3\omega t)$$

or: the fundamental component will be cancelled if $c^*A^2=-4/3$, while the $3^{rd}$ harmonic is still present. Thus the transfer function of the combination of gain stages is an (piece-wise linear) approximation of a Taylor polynomial.

Similar circuits can be realized for generating the fifth, seventh of higher harmonics. Of course, the invention is applicable when bipolar transistors (or any other type of active components) are used. It can also be applied on GaAs ASICs or any other technology. As will be apparent to those skilled in the art, more than three stages can also be used to more exactly shape the transfer function.

The apparatus and method of the present invention can be used in all analog integrated circuits that require the generation of the $3^{rd}$, $5^{th}$, or higher order harmonics from a certain fundamental frequency. The present invention is particularly useful in the generation of local oscillator signals in radios that avoid pulling phenomena, such as wireless personal area networks (WPANs) and local area networks (WLANs) in which an RF transmitter comprises a mixer configured to modulate the output signal of the LO with a data signal. Networks to which the present invention applies may further include GSM, Bluetooth, and DECT devices. In practice, most WLANs would include a much larger number of mobile transceivers incorporating the present invention.

While the preferred embodiments of the present invention have been illustrated and described, it will be understood by those skilled in the art that the circuit as described herein is illustrative and various changes and modifications may be made thereto and equivalents may be substituted for elements thereof without departing from the true scope of the present invention. In addition, many modifications may be made to adapt the teachings of the present invention to a particular situation without departing from its central scope. Therefore, it is intended that the present invention not be limited to the particular embodiments disclosed as the best mode contemplated for carrying out the present invention, but that the present invention include all embodiments falling with the scope of the appended claims.

The invention claimed is:

1. A circuit for generating a transmit signal having a desired frequency, the circuit comprising: a transmit-generation circuit including a first comparator, a second comparator having a predetermined offset voltage, and an adder to sum the outputs of the first and second comparators, wherein the transmit-generation circuit is configured to receive a sinusoidal signal having a first frequency and derive therefrom the transmit signal having the desired frequency such that there is no harmonic relation between the desired frequency of the transmit signal and the first frequency, and the second comparator generates an output signal when the sinusoidal signal is larger than its offset voltage.

2. The circuit of claim 1, further comprising: a third comparator having a predetermined offset voltage, wherein the third comparator generates an output signal when the sinusoidal signal is larger than its offset voltage.

3. The circuit of claim 1, wherein an output signal of the first comparator is an amplified version of the sinusoidal signal.

4. The circuit of claim 1, further comprising:
a third comparator connected to the sinusoidal signal with a predetermined offset voltage inserted in series with a gate of a transistor of the third comparator, wherein the third comparator generates an output signal when the sinusoidal signal is larger than its offset voltage.

5. The circuit of claim 1, wherein the desired frequency is a harmonic of the sinusoidal signal.

6. The circuit of claim 5, wherein the desired frequency is a third, fifth or higher order odd harmonic.

7. A method for generating a transmit signal having a desired frequency, the method comprising:
receiving an input signal having a first frequency;
processing the input signal by a first comparator;
processing the input signal by a second comparator having a predetermined offset voltage, wherein the second comparator generates an output signal when the signal is larger than the offset voltage;
adding the outputs of the first and second comparators to derive the transmit signal having the desired frequency such that there is no harmonic relation between the desired frequency of the transmit signal and the first frequency.

8. The method of claim 7, further comprising: processing the input signal by a third comparator having a predetermined offset voltage, wherein the third comparator generates an output signal when the sinusoidal signal is larger than its offset voltage.

9. The method of claim 7, wherein the desired frequency is a harmonic of the input signal.

10. The method of claim 9, wherein the desired frequency is a third, fifth or higher order odd harmonic.

11. At least one circuit for generating a signal having a desired frequency, the at least one circuit comprising: a first comparator, a second comparator having a predetermined offset voltage; and an adder to sum the outputs of the first and second comparators, wherein the first comparator is configured to receive a sinusoidal input signal having a first frequency; the second comparator is connected to the sinusoidal input signal with a predetermined offset voltage inserted in series with the gate of a transistor of the second comparator; the comparators operate on the sinusoidal input signal by approximating a desired transfer function to derive the signal having the desired frequency being a third, fifth or higher order odd harmonic of the sinusoidal input signal while substantially canceling other frequencies; an output signal of the first comparator is an amplified version of the sinusoidal input signal; and the second comparator generates an output signal when the sinusoidal input signal is larger than its offset voltage.

12. The at least one circuit of claim 11, wherein the comparator functions and the gain functions are combined in differential pairs or the comparator functions and the gain functions are implemented in two separate circuits.

13. The at least one circuit of claim 11, wherein a third comparator is connected to the sinusoidal input signal with a predetermined offset voltage inserted in series with a gate of one transistor of the third comparator, and the third comparator generates an output signal when the sinusoidal input signal is larger than its offset voltage.

14. The at least one circuit of claim 11, wherein the transfer-function is a Taylor polynomial transfer function.

15. The at least one circuit of claim 14, wherein the Taylor polynomial transfer function is represented according to the following equation: $y=x+c*x^3+e*x^5$ with y being the output signal, x being the sinusoidal input signal, and c being a constant.

16. A method for generating a signal having a desired frequency, the method comprising:
receiving a sinusoidal input signal having a first frequency, wherein the sinusoidal input signal is input to a first comparator, and a second comparator is connected to the sinusoidal input signal with a predetermined offset voltage inserted in series with the gate of one transistor of the second comparator;
processing the sinusoidal input signal by the first comparator;
processing the sinusoidal input signal by the second comparator, wherein the comparators operate on the sinusoidal input signal by approximating a desired transfer function, the output signal of the first comparator is an amplified version of the sinusoidal input signal, and the second comparator generates an output signal when the sinusoidal input signal is larger than its offset voltage; and
adding the outputs of the first and second comparators to derive the signal having the desired frequency being a third, fifth or higher order odd harmonic of the input signal while substantially canceling other frequencies.

17. The method of claim 16, wherein the transfer-function is a Taylor polynomial transfer function.

18. The method of claim 16, further comprising: processing the sinusoidal input signal by a third comparator, wherein the third comparator is connected to the sinusoidal input signal with a predetermined offset voltage inserted in series with the gate of one transistor of the third comparator, and the third comparator generates an output signal when the sinusoidal signal is larger than its offset voltage.

* * * * *